United States Patent [19]
Fouquet

[11] Patent Number: 5,252,839
[45] Date of Patent: Oct. 12, 1993

[54] SUPERLUMINESCENT LIGHT-EMITTING DIODE WITH REVERSE BIASED ABSORBER

[75] Inventor: Julie E. Fouquet, San Carlos, Calif.

[73] Assignee: Hewlett-Packard Company, Palo Alto, Calif.

[21] Appl. No.: 896,276

[22] Filed: Jun. 10, 1992

[51] Int. Cl.$^5$ .............................................. H01L 33/00
[52] U.S. Cl. ....................................... 257/13; 257/97; 257/95; 257/99; 372/48
[58] Field of Search ....................... 257/13, 94, 95, 96, 257/97, 99; 372/45, 46, 48

[56] References Cited

U.S. PATENT DOCUMENTS

| | | | |
|---|---|---|---|
| 4,975,752 | 12/1990 | Kashima et al. | 257/97 X |
| 5,014,280 | 5/1991 | Sanada et al. | 372/45 |
| 5,126,803 | 6/1992 | Hager et al. | 257/94 |

FOREIGN PATENT DOCUMENTS

| | | | |
|---|---|---|---|
| 60-34089 | 2/1985 | Japan | 372/48 |
| 51-161786 | 7/1986 | Japan | 372/48 |

OTHER PUBLICATIONS

Dykaar et al., "Large-Signal Picosecond Response of InGaAs/InP Quantum Well Lasers with an Intracavity Loss Modulator," *Appl. Phys. Lett.* 56(17), Apr. 23, 1990, pp. 1629–1631.

Berthold et al., "Voltage-Controlled Q Switching of InGaAs/InP Single Quantum Well Lasers," *Appl. Phys. Lett.* 55(19), Nov. 6, 1989, pp. 1940–1942.

Levi et al., "Multielectrode Quantum Well Laser for Digital Switching", *Appl. Phys. Lett.* 56(12), Mar. 19, 1990, pp. 1095–1097.

*Primary Examiner*—William Mintel

[57] ABSTRACT

A non-lasing edge-emitting LED (30) suitable for precision reflectometry has an absorber region (52) which is reverse-biased via a contact (58) to absorb light by Stark absorption or Franz-Keldysch effect. During operation, the gain region (50) is forward biased via contact (56) to produce light emission including stimulated emission from an edge of the device, The absorber region is sized to a length $L_\alpha > (gL_g - \frac{1}{2}\ln(1/R_1 R_2))/\alpha$ where $g$ and $\alpha$ are coefficients of gain and absorption and $R_1$ and $R_2$ are the front and back facet (60, 64) reflectivities, such that round-trip power loss through the cavity is at least 60 dB. The length $L_\alpha$ is sufficient to preclude regenerative oscillation of light in the cavity during light emission including stimulated emission. Antireflection measures further reduce end facet reflectivity, limiting signal contributions due to internal reflections to less that −85 dB below the primary output signal. Controlling cavity width reduces sidewall reflections and using step-biased segmented contacts reduces gain/absorber interface reflections.

13 Claims, 7 Drawing Sheets

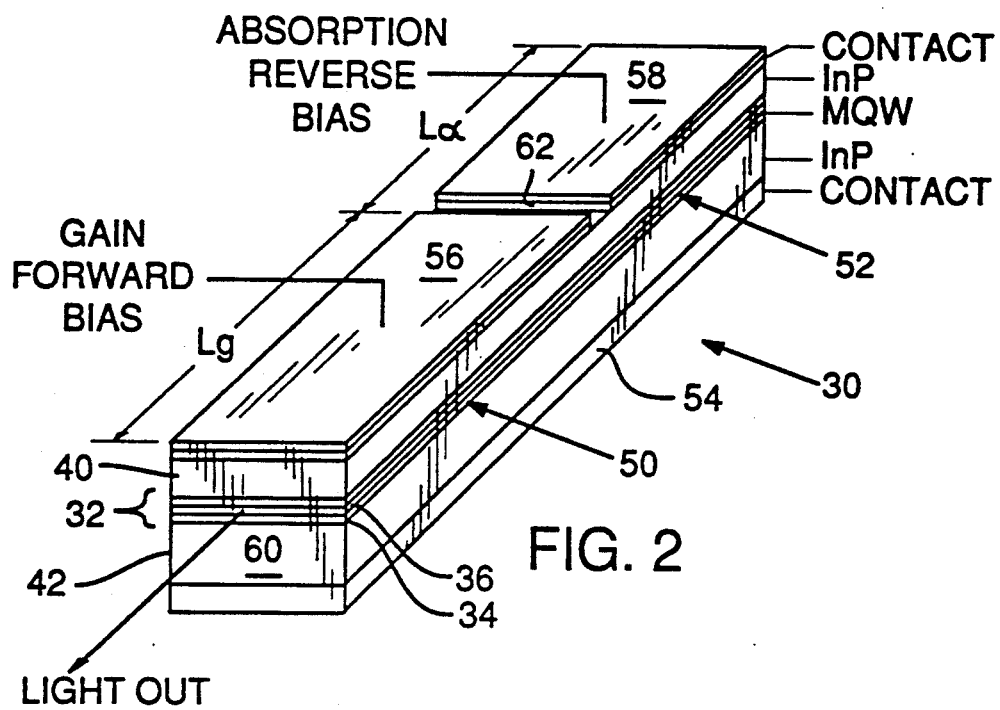
FIG. 2
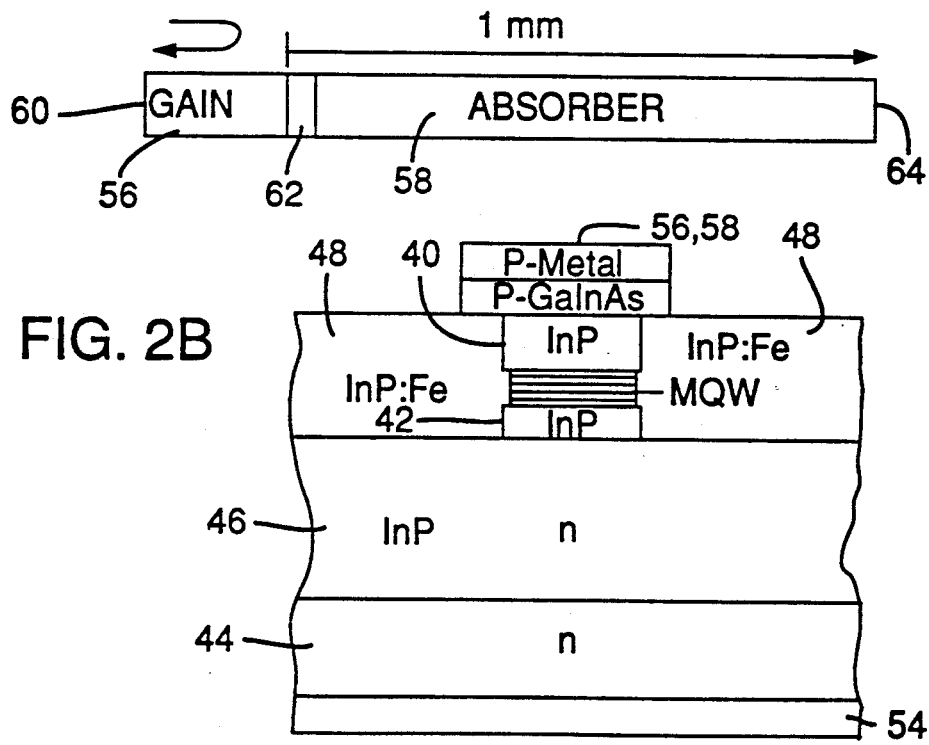
FIG. 2A
FIG. 2B

| FULL FORWARD BIAS | STEP DOWN | | | REVERSE BIAS |
|---|---|---|---|---|
| 56 GAIN | 57A | FORWARD BIAS 57B | 57C | 58 ABSORBER |

56A GAIN — 62A — 58A ABSORBER

56A GAIN — 59 STEP DOWN — 58A ABSORBER $V_{ba}$ = VOLTAGE ON LONG BACK CONTACT, V

SUPERLUMINESCENT LIGHT-EMITTING DIODE WITH REVERSE BIASED ABSORBER

BACKGROUND OF THE INVENTION

This invention relates generally to semiconductor lasers and light-emitting diodes and more particularly to a nonlasing superluminescent LED suitable for applications requiring a low internal reflectivity source.

There is a substantial need for fast and bright sources for optical communications and other purposes. At wavelengths of 1.3 and 1.55 microns, all sources suffer from Auger recombination, an essentially nonradiative process which competes with the active radiative mechanism, thus reducing the light output. In a normal light-emitting diode (LED), the radiative mechanism is spontaneous bimolecular radiative recombination. In a laser, the radiative mechanism is stimulated emission. Both the Auger recombination and the bimolecular recombination rates increase with increasing carrier density, but the Auger rate increases more rapidly. Because Auger recombination is so strong, the carrier density must be kept low for high efficiency, but then the decay rate is so slow that the LED is not very fast. Alternatively, the carrier density can be driven higher so that the decay rate is fast, but then Auger recombination dominates and the LED is very dim.

Stimulated emission is a more rapid process than bimolecular recombination at the lower carrier densities mentioned above, thus competing more effectively with Auger recombination. Quantum well solid state lasers with fast switching of large optical signals are described in K. Berthold, et. al., Voltage-controlled Q switching of InGaAs/InP single quantum well lasers, Appl. Phys. Lett. 55(19), pp. 1940–42, Nov. 6, 1989, and D. R..Dykaar, et. al., Large-signal picosecond response of InGaAs/InP quantum well lasers with an intracavity loss modulator, Appl. Phys. Lett. 56(17), pp. 1629–31, Apr. 23, 1990. These devices have a quantum well structure having a cavity length $L_c$ of 300 microns divided into long gain regions ($L_g$=268 micron) and a short intracavity absorption region ($L_A$=2-20 microns) that can be biased with 6 micron separations (total $L_a$=1-4-32 microns). With a suitable combination of forward and reverse biases applied respectively to the gain and absorption regions, the laser diode can be made to operate in either normally-on or normally-off states, and can be actively Q-switched by voltage control to generate short optical pulses. These devices have been adapted to digital optical switching by A. F. J. Levi et. al., Multielectrode quantum well laser for digital switching, Appl. Phys. Lett. 56(12), pp. 1095-97, Mar. 19, 1990.

The output of a laser may suffer, however, from problems of catastrophic degradation. Importantly, the narrow bandwidth of a laser optical output is unsuited for many applications such as optical time domain and optical coherence domain reflectometry (also called precision reflectometry). For precision reflectometry, it is preferable to have a source that provides a high power output over a broader bandwidth than a laser provides. Coherence domain reflectometry also requires a low reflectivity light source, preferably having internal reflected signal amplitudes 70 dB or more below the output signal level.

Superluminescent LEDs (SLEDs) utilize stimulated emission as their primary radiative mechanism, but do not exceed the threshold for oscillation. They do not form hot spots and do not catastrophically degrade. SLEDs made of bulk material tend to lase when the temperature is lowered, however, confining the operating specifications to an impractically narrow range of temperature. To prevent lasing at long wavelengths, pumping must be further decreased, at the cost of output power.

Because of this problem (and perhaps others), researchers have concentrated on fabricating SLEDs using low mirror losses to prevent regenerative oscillation. Antireflection coatings are difficult to manufacture, however, and these devices are very susceptible to lasing as a long cavity laser if light is reflected back into them from an external surface. Another approach, employed in a commercially-available LED offered by Laser Diode Inc. of Edison, N. J. (LDI) for use in reflectometry, uses a 178 micron active gain region and a 533 micron passive absorber, both formed in bulk material. This device has an internal reflection signal power of about 40 dB below the main output signal even with 3% antireflection coatings on both facets and low internal reflectance. While the device is usable and better than other available sources, this level of reflections is still much higher than optimal for precision reflectometry.

Accordingly, a need remains for faster, broadband, and bright sources for optical communications, reflectometry and other uses.

SUMMARY OF THE INVENTION

Therefore, an object of the invention is to obtain a brighter non-lasing light source with a broader bandwidth than produced by either a conventional, SLED or semiconductor laser.

Another object of the invention is to prevent regenerative oscillation of a superluminescent or edge-emitting LED over a wide temperature range.

A further object of the invention is to reduce the criticality of antireflection coatings, to avoid introducing sources of reflections, and preferably to minimize reflections and their contribution to the device output beam.

The invention is a non-lasing edge-emitting LED comprising a semiconductor heterostructure body including a stack of parallel layers forming a PN junction to define an elongate optical cavity. The cavity includes a gain region of a length $L_g$ and an optical absorber region in series with the gain region. The optical absorber region has an absorption spectrum which absorbs a spectral portion of light transmitted from the gain region. The device includes contact means for biasing the PN junction, including a gain contact for forward biasing the gain region so as to produce light emission, including stimulated emission, at an edge of the stack (the front facet), and an absorber contact for reverse biasing the absorber to shift the absorption spectrum to a lower energy, thereby blocking a greater proportion of the spectrum of the light transmitted from the gain region. The optical absorber region must have a length $L_a$ sufficient to preclude regenerative oscillation of light in the cavity during light emission.

The absorber region is sized to a length $L_a$ such that the round trip gain of light reflected through the cavity from the front back facets and through the absorber is less than unity during light emission. In practice, this requires a reverse-biased absorber length $L_a$ of at least 50 microns, preferably equal to or exceeding the length $L_g$ of the gain region (e.g., 300 microns). For very low internal reflectance ($< -70$ dB) applications, the absorber length $L_a$ should preferably be about 1 mm. or longer. Preferably, the invention is implemented in a quantum well structure having a quantum-confined Stark effect absorber, and may be referred to as either a superluminescent LED (QWSLED) or quantum well edge-emitting LED (QWEELED).

This device fulfills the need for a fast, bright emitter which does not catastrophically degrade and in which laser operation at cold temperatures can be prevented. Quantum well SLEDs can be faster than conventional LEDs for comparable output intensities. Although not as bright as lasers, QWSLEDs do not suffer from catastrophic degradation and thus should be more reliable than lasers.

Using a long optical Stark absorber in series with the quantum well structure prevents lasing at all practical temperatures even when the gain region is biased to provide a high power optical output. It is advantageous compared to reducing reflections with antireflection coatings alone because long absorbers are easier to fabricate than antireflection coatings and because the long-absorber quantum well SLED structure is less susceptible to external feedback. Anti-reflection measures can be used in addition, however, and are used in a preferred embodiment designed for use in precision reflectometry applications. Such measures are less critical and more effective than in conventional SLEDs.

In quantum well edge-emitting LED devices according to the invention, it is easier to prevent lasing at low temperatures and still maintain a strong superluminescent output than in bulk SLEDs. If lasing is not prevented at low temperatures simply by using an unbiased quantum well absorber, as may occur if bandgap renormalization (the decrease in bandgap at high carrier densities) in the gain region forces the band edge to longer wavelengths, a reverse bias can be applied to contacts on the absorber to move the absorption spectrum out to longer wavelengths via the Stark effect. The absorption curve shifts to longer wavelengths with an electric field applied normal to the plane of the quantum wells more nicely than the absorption curve shifts with applied electric field in bulk materials. Thus, a QWSLED utilizing the Stark effect in the absorber attenunates reflections better than a similar bulk SLED. Moreover, laser action can be prevented without modifying doping of the active gain region, which would affect its refractive index and increase reflectivity within the device.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 2 is a partial sectional and perspective view of the active device structures of a quantum well superluminescent LED (QWSLED) with optical Stark absorber in accordance with the invention.

FIG. 2A is a top plan view of a preferred, low-internal reflectance embodiment of the device of FIG. 2.

FIG. 2B is a more detailed transverse sectional view of the device of FIG. 2.

DETAILED DESCRIPTION

Analysis of Problems in the Prior Art

The preferred embodiment of the invention is a quantum well edge-emitting or superluminescent LED (QWEELED or QWSLED) with a quantum-confined optical Stark absorber arranged to preclude regenerative oscillation and resultant laser action, particularly as occurs at low temperatures in conventional superluminescent LEDs. As temperature of a SLED decreases, the bandgap energy of the semiconductor increases. Superposed on this shift, the gain spectrum becomes much narrower and sharper and moves towards longer wavelengths, as the Fermi function redistributes electrons closer to the conduction band edge. Apparently, even if the pumping level is decreased so that the gain peak magnitude is below the highest absorption magnitude, the gain may still exceed the losses at long wavelengths and a conventional SLED will lase.

Figure 1:
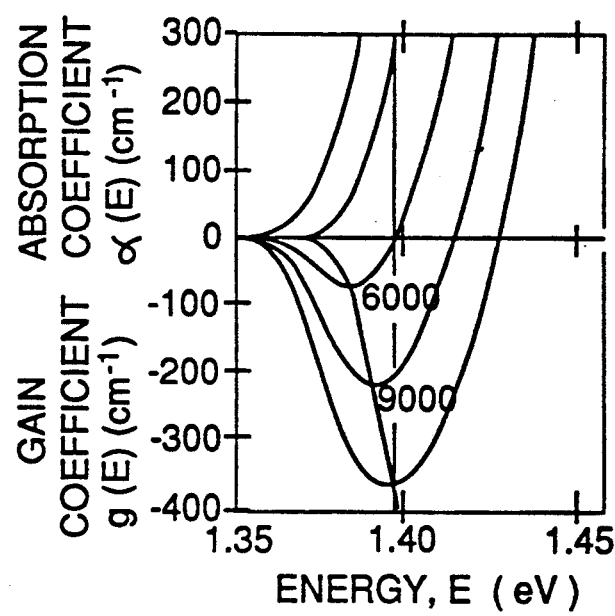
FIG. 1 is a diagram of absorption and gain coefficients $\alpha$ and $g$ calculated for GaAs at different current densities.
Figure 1A:
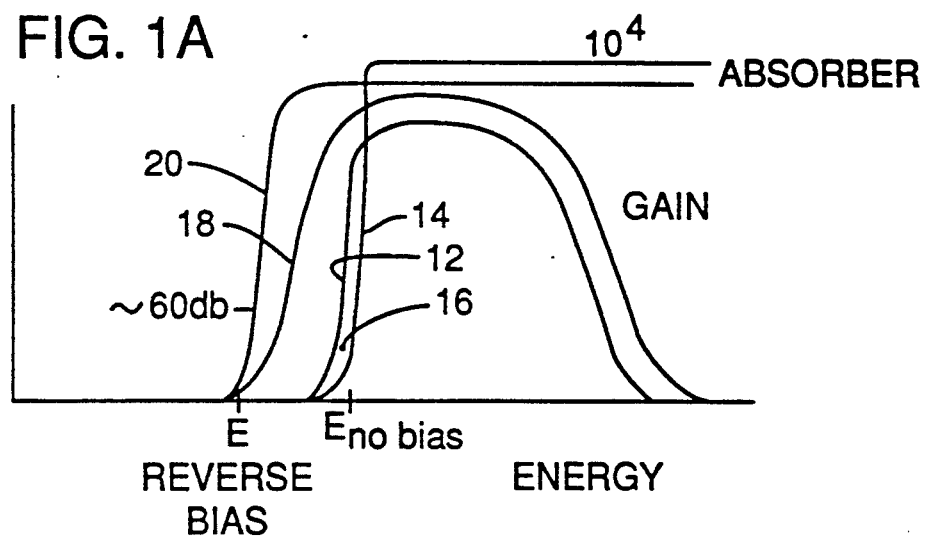
FIG. 1A is a diagram of the gain and absorption curves comparing the effect of optical Stark absorption under no-bias and reverse-bias conditions.

This problem is illustrated in part by FIG. 1, which is reproduced in part from H. D. Casey, Jr. and B. Panish, Heterostructure Lasers, Part A: Fundamental Principles, New York, Academic Press, 1978, p. 172, quoted from F. Stern, J. Appl. Phys., 47, 1976, p. 5382. The problem is shown further by FIG. 1A, which shows a gain curve 12 for a SLED and an absorption curve 14 for an unbiased absorber, with an area of overlap 16 between the tails of energy curves 12, 14 which produces net gain, which can lead to regenerative oscillation. In contrast, a heavily-pumped SLED with a long, reverse-biased absorber in accordance with the invention has a gain curve 18 shifted by band gap renormalization and an absorption curve 20 that is shifted under reverse bias so that the gain curve is contained within the absorption curve. This means there is essentially no wavelength at which the gain exceeds the absorption to cause regenerative oscillation. The peak absorption $a_p \times L_a$ is preferably at least 60 dB over the peak gain $g_p \times L_g$ to suppress lasing. The quantum well structure of the preferred embodiment further described below easily exceeds this objective.

Figure 1B:
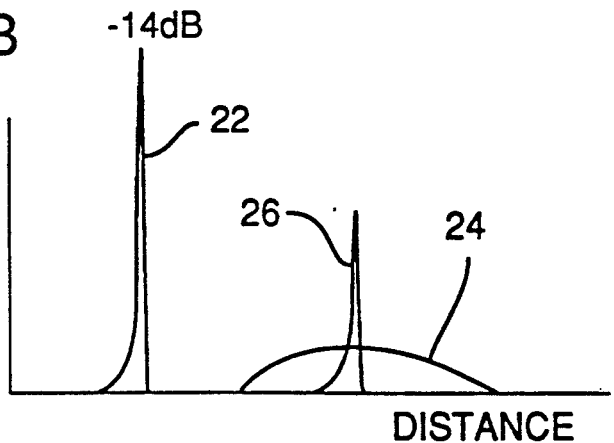
FIG. 1B is a diagram of intensities of primary and reflected light signals in a coherence domain reflectometry system.

The invention further serves to minimize reflected components in the output signal which, in conventional SLED devices, are an obstacle to their use in reflectometry or require critical antireflection measures. This problem is illustrated in FIG. 1B which shows reflectivity as a function of distance. The light signal 22 emitted by an LED transmitted through an optical system, such as an optical fiber, will be reflected back as an attenuated signal 24 from any reflective anomalies in the system. If the emitted light signal includes an internally reflected signal component 26, both internally-reflected signal 26 and externally reflected signal 24 will be superposed such that user may confuse the internally reflected signal 26 with an external reflection from a defect at some distance.

Figure 13:
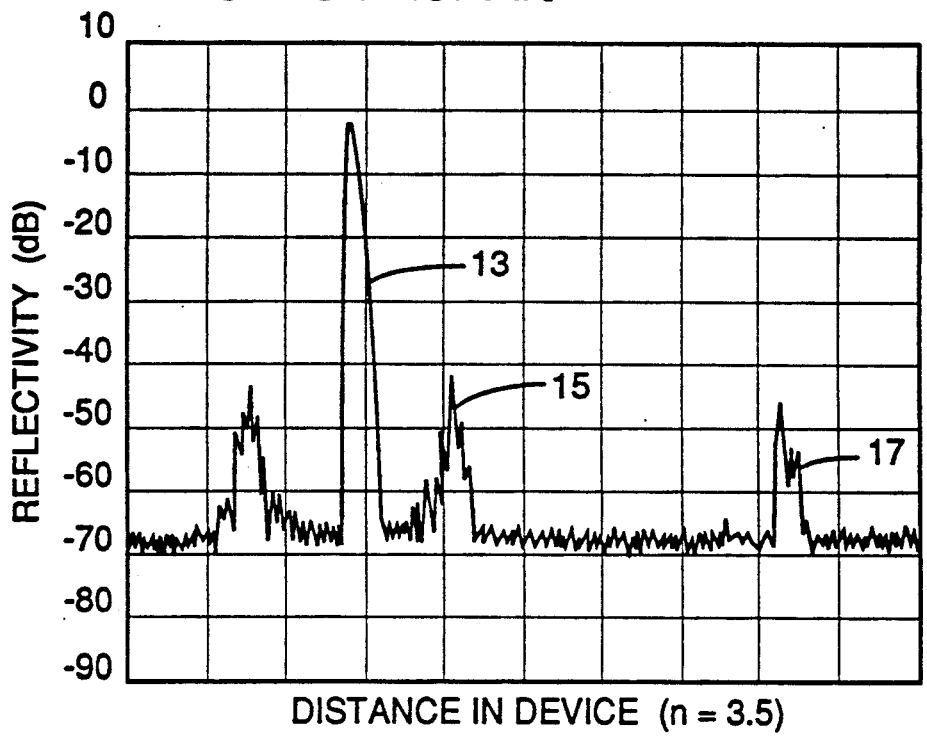
FIG. 13 is a source spectrum of a prior art LED source used in precision reflectometry.

Ideally, a source for coherence domain reflectometry has a substantially uniform spectral output with no internally reflected signals 26. If the source has considerable internal reflectivity, e.g., −10 dB, it will produce a nonuniform output spectrum (as a function of wavelength), caused by increased stimulated emission at the oscillation modes of the cavity. If the internal reflectivity is substantially lower, e.g.—40 dB, this nonuniformity will not be observed in the optical spectrum. However, this spectral nonuniformity will produce a confusing reflectrometry signal as shown in FIG. 13 for the LDI source. The largest peak 13 is the reflection response of the main EELED signal from a mirror. The peak 15 results from an internal reflection from the gain/absorber interface. And peak 17 results from a reflection from the back facet.

Thus, it is important to suppress internally-generated reflections in a light source for reflectometry. This is done in the invention by using a long, reverse-biased absorber, enhanced by the antireflection measures and quantum well active region discussed below.

Description of construction and operation of the invention

FIGS. 2, 2A, 2B and 5 illustrate a preferred embodiment of a on-lasing edge-emitting LED according to the invention in the form of a quantum well edge-emitting LED (QWEELED) 30. The physical device structure comprises a semiconductor heterostructure body including a stack of parallel layers forming an active region 32 with a PN junction to define an elongate optical cavity. The active region 32 consists of a multiple quantum well (MQW) structure in the form of a stack of alternating layers of GaInAs or GaInAsP quantum wells 34 (approximately 40 Angstroms wide for 1.3 micron emission) and GaInAsP barriers 36 (e.g., 100–200 Angstroms) between the wells. The doping should be p-n or p-i-n, arranged for good carrier injection into the active region. The stack is formed by a conventional fabrication process as an elongate stripe which can have a conventional stripe with of about 2 microns but preferably at least 7 microns, e.g., 8 microns.

Above and below the active region of the long wavelength QWSLED are layers 40, 42 of InP, which has a higher bandgap than GaInAs and thus forms a good waveguide cladding while confining carriers vertically in the active region. The device is grown on an InP substrate 44, typically with a buffer layer 46, both doped n-type, and with lateral semi-insulating isolation layers 48, for example of InP:Fe, as shown in FIG. 2A.

The cavity includes a gain region 50 of a length $L_g$ and an optical absorber region 52 in series with the gain region, with contacts formed externally to the p and n outer layers for biasing the PN junction, requiring the deposition of contacting layers 56, 58. Rather than two continuous contacts across the device, however, one of the contacts must be split in at least one location to allow a forward bias to be applied to the gain region while a reverse bias is applied to the absorption region for the Stark effect. Any number of lateral structures can be used as long as the gain path is forced to be continuous with an absorption path.

Referring to FIG. 2B, the lower or n-type contact 54 is formed on the backside of the substrate 44. Two metal on p-type GaInAs contacts are formed over the active region, each extending along a portion of the length of the cavity. The first contact is a gain contact 56 aligned over the gain region 50 for forward biasing the gain region. The gain region and contact are sized to a length $L_g$ and biased in operation to produce light emission including stimulated emission from an edge of the stack at the front facet 60 of the device. The output signal can be taken at the gain end of the device for the highest level. This facet may be antireflection (AR) coated to some degree if desired, consistent with concerns about reproducibility of the AR coating and external feedback.

The second contact is an absorber contact 58 for reverse biasing the absorber region to shift the absorption spectrum therein to a lower energy. The absorber contact is spaced lengthwise from the gain region by a gap 62 and is sized to a length preferably at least as great as the gain contact to form an absorber region of a total length $L_a$ such that the round trip gain of light reflected through the cavity from the back facet 64 of the absorber is less than unity, during light emission including stimulated emission from the front facet. The optical absorber region should have a length $L_a$ sufficient to preclude regenerative oscillation of light in the cavity during light emission, and preferably be long enough to assure that output reflections remain at least 70 dB below the output signal.

Figure 5:
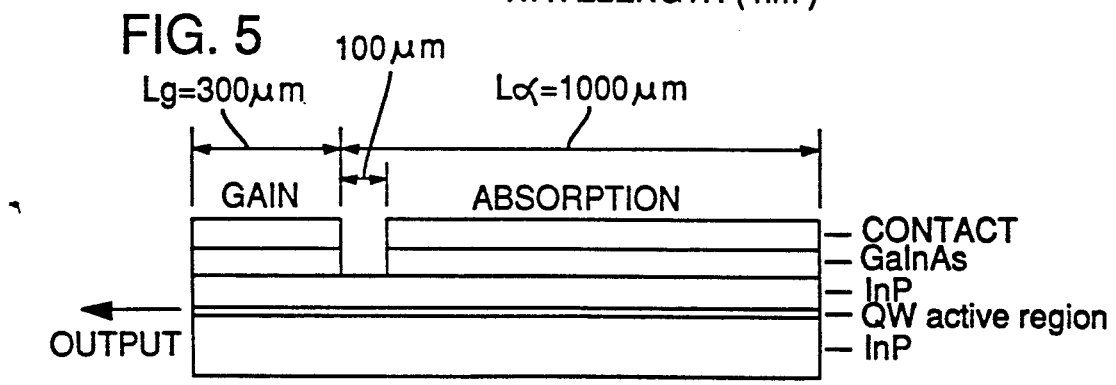
FIG. 5 is a lengthwise sectional view of an operative example of a device in accordance with the invention.

In an operative example of device 30 shown in FIG. 5, the gain region has a length $L_g$ of 300 microns, the spacing between the gain and absorber contacts is 100 microns, the absorber contact is 900 microns in length and the absorber region has a total length $L_a$ of 1000. In practice, this requires a reverse-biased absorber length $L_a$ of at least 50 microns, preferably equal to or exceeding the length $L_g$ of the gain region (e.g., 300 microns). For very low internal reflectance (< −70 dB) applications, the absorber length $L_a$ should be about 1 mm. or longer. With a very long absorber region, e.g., at least 1 mm., reverse biasing of the absorber is not essential to preclude regenerative oscillation, but it will reduce the magnitude of internal reflections.

Device 30 is shown as an integrated device, with both the gain and absorption regions on one wafer, but the device does not have to be integrated. This device can be fabricated in a number of III-V materials systems; for example, GaAs/AlGaAs at <1 um and GaInAs/-GaInAsP/InP or GaInAsP/GaInAsP/InP at >1 um.

Lattice-matched systems are preferred for reliability and low nonradiative recombination, but non-lattice matched systems, such as GaInAs/GaAs/AlGaAs at about 1 um, may be used also. Other materials systems, for example, GaAlAsSb, can be used. Because our greatest interest is optical communications at 1.3 um and because of experience with lattice matched Ga(0.5)In(0.5)As/InP quantum wells at this wavelength, GaInAs/GaInAsP/InP is used as the example. In practice, higher quality 1.3 um emitting quantum wells may be grown in GaInAsP/GaInAsP/InP.

The use of an MQW active region rather than a single quantum well (SQW) or a few QWs is appropriate for long wavelength emitters because of the need to keep the carrier density low to avoid Auger recombination. For shorter wavelengths, such as in the GaAs/AlGaAs system, where Auger recombination is not a problem, a SQW or few-QW structure may be best because it favors radiative recombination over linear nonradiative mechanisms.

In operation it is necessary to stay below lasing threshold, which is given by the expression below, at all wavelengths $$R_1 R_2 \exp[2(gL_g - \alpha L_a)] = 1$$

where $R_1$ and $R_2$ are the facet power reflectivities, $g$ is the gain per cm, $L_g$ is the length of the gain region in cm, $\alpha$ is the absorption per cm, and $L_a$ is the length of the absorption region per cm. This intensity condition for oscillation can be rewritten as $$gL_g = \alpha L_a + \tfrac{1}{2}\ln(1/R_1 R_2)$$

after taking the natural logarithm. The device of FIG. 5 readily meets this condition at all wavelengths.

Figure 3:
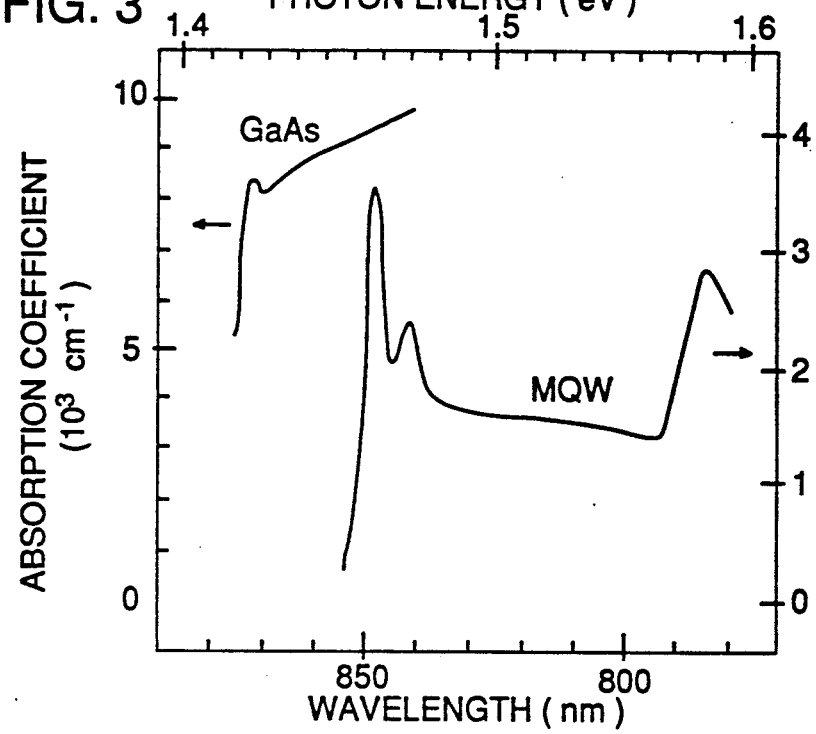
FIG. 3 is a diagram of the linear absorption spectra of room-temperature GaAs and multiple quantum well (MQW) devices.
Figure 4:
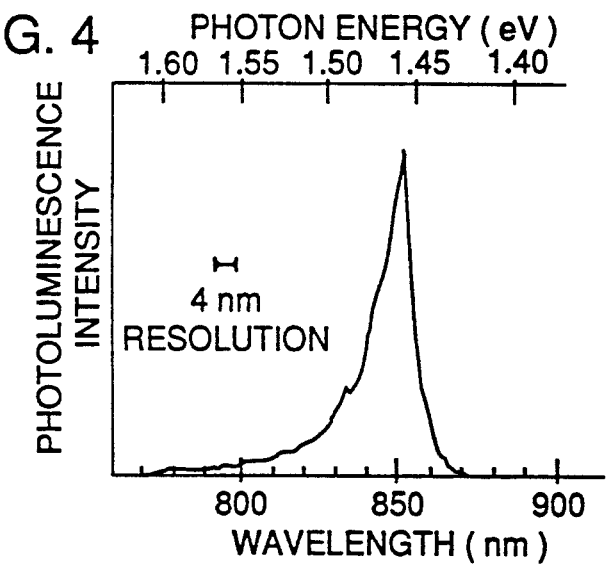
FIG. 4 is a diagram of a time-integrated photoluminescence spectrum of a multiple quantum well device.

In general, the absorption spectrum in these semiconductors looks similar to the density of states in the conduction band. However, absorption may take place below the bandgap if the doping level is high enough to cause the formation of bandtails. The absorption curve for a GaAs/AlGaAs MQW structure with relatively low doping is reproduced in FIG. 3 from D. A. B. Miller, D. S. Chemla, D. J. Eilenberger, P. W. Smith, A. C. Gossard and W. T. Tsang, Large room-temperature optical nonlinearity in GaAS/Ga(1−x)A1(x)As multiple quantum well structures, Appl. Phys. Lett., 41(8), Oct. 15, 1982. The two sharp peaks are due to absorption into excitons, which are bound electron-hole pairs within the semiconductor. The photoluminescence of a similar structure, also grown by A. C. Gossard, is shown in FIG. 4, reproduced from J. E. Fouquet and A. E. Siegman, Room-temperature photoluminescence times in a GaAs/Al(x)Ga(1−x)As molecular beam epitaxy multiple quantum well structure, Appl. Phys. Lett., 46(3), Feb. 1, 1985. The emission spectrum is sharper on the lower energy side of the peak, representing the constant density of states above the bandedge. The gradual decrease on the high energy side is the result of the Fermi function filling of the quantum well. Emission may be present at longer wavelengths if the structure is heavily doped due to bandtailing or if the structure is heavily pumped due to bandgap renormalization.

If the structure lases at long wavelengths at room temperature, the quantum wells in the gain region may be disordered slightly to shift gain to shorter wavelengths, thereby preventing lasing. This effect on the gain spectrum is permanent. The absorption spectrum can also be temporarily shifted to longer wavelengths by applying an electric field perpendicular to the wells, as described in, for example, I. Bar-Joseph, C. Klingshirn, D. A. B. Miller, D. S. Chemla, U. Koren and B. I. Miller, Quantum-confined Stark effect in InGaAs/InP quantum wells grown by organometallic vapor phase epitaxy, Appl. Phys. Lett., 50(15), Apr. 13, 1987. This effect, called the Stark effect, can be used to prevent lasing at low temperatures in a device which does not normally lase at room temperature. When the temperature again rises, the electric field can be removed and the SLED can function as it originally did at room temperature.

Figure 14A:
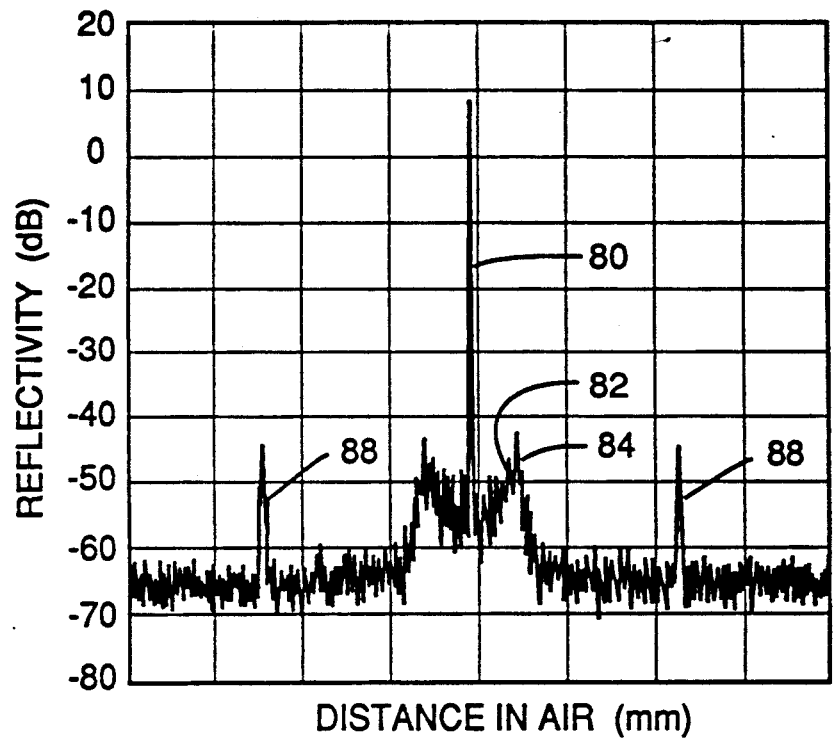
FIGS. 14A and 14B are precision reflectometer spectra showing the advantages of the device of the present invention.
Figure 14B:
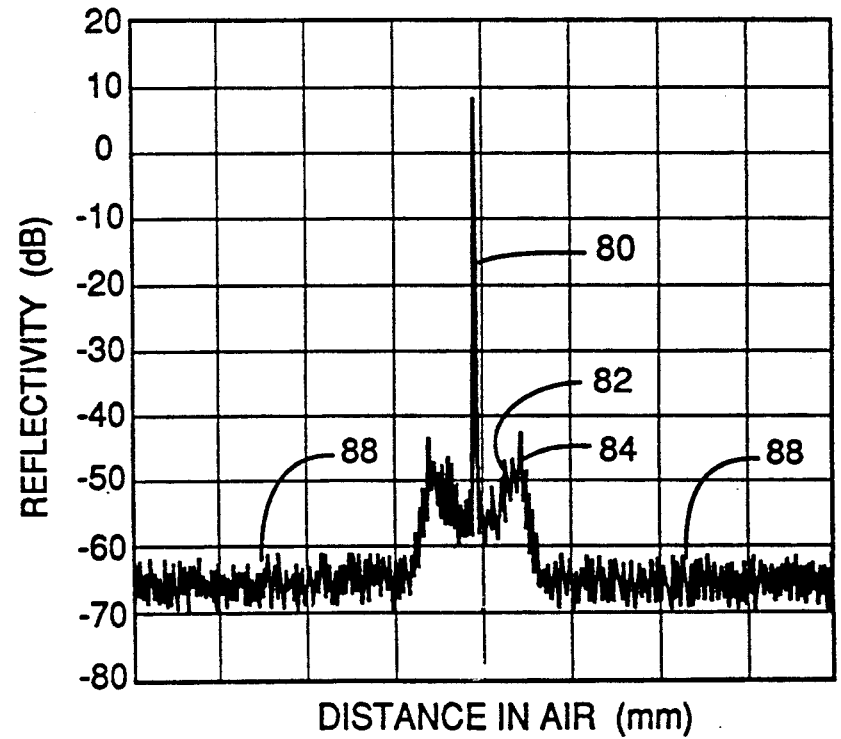

In an operative example of the device in FIG. 5, the 300 micron gain region was forward biased to a current of 75 mA, while the 900 micron absorber contact was biased from −2 V. to −4 V. The reverse-biased quantum confined Stark absorber alone reduced the level of back facet reflections of the EELED to −75 to −85 dBc. FIGS. 14A and 14B show spectra of this device when the absorber region is reverse biased at zero and at −4 V. The main signal peak is indicated by reference numeral 80. Proceeding laterally from signal peak 80 are lower but still noticeable V-shaped signals 82 culminating in peaks 84. Peaks 88 in FIG. 14A are due to the back facet internal reflection, which is only minimally attenuated by the absorber at zero volts reverse-bias. In FIG. 14B, when the absorption region is reverse-biased at −4 volts, signal peaks 88 virtually disappear into the detector noise. When the receiver gain is increased and bandwidth is decreased to heighten sensitivity over detector noise, it can be seen in FIG. 14B that peaks 88 are 75 to 85 dB below primary signal 80 when the absorption region is reverse biased at −4 volts.

Figures 10, 11, 12, 15:
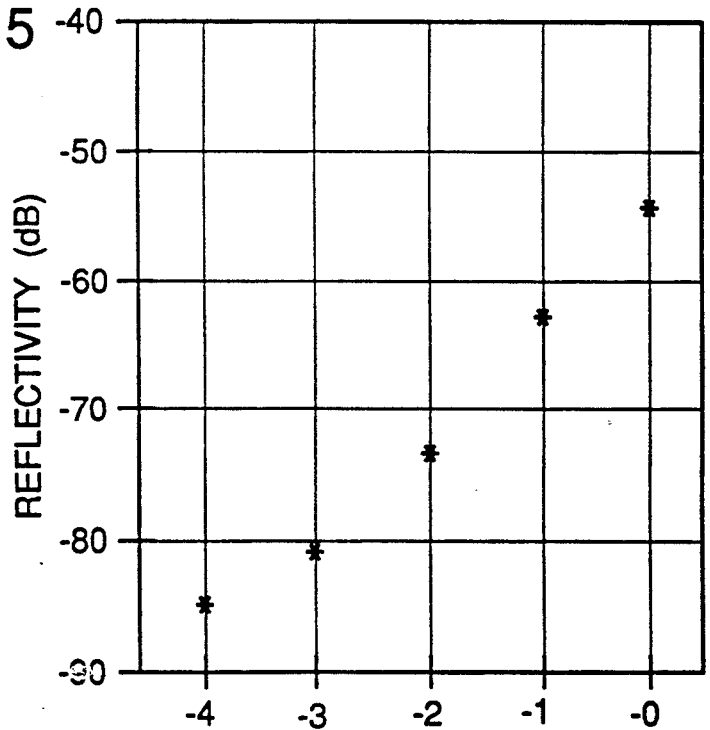
FIGS. 10, 11 and 12 are top plan views of alternative embodiments of biasing structures in the present invention.
FIG. 15 is a plot back facet reflectivity against absorber reverse bias voltage in the device of the present invention.

FIG. 15 shows how back facet reflectivity decreases as the magnitude of reverse bias on the absorber is increased. Increasing the magnitude of reverse bias also increases absorption more strongly at longer wavelengths. A shorter absorber region, however, does not work as well. For example, operating the foregoing type device backwards, applying a bias of −2 to −3 volts to the short contact and a forward bias current of 75 mA to the long contact yields reflectivity signals between −60 and −65 dB. This is better than the LDI device, even though the absorber here is 300 micron vs. 533 microns for the LDI device and the device here lacks AR coatings. This advantage is due to use of both a quantum well structure as the active region and reverse biasing the absorber. Adding a conventional three layer broadband anti-reflection (AR) coating to the front (not back) facet 60 reduced all reflection signal features by 25 to 30 dB. The resulting reflection from the back facet is so low that it can no longer be measured when a reverse bias is applied to the Stark absorber.

Figure 16:
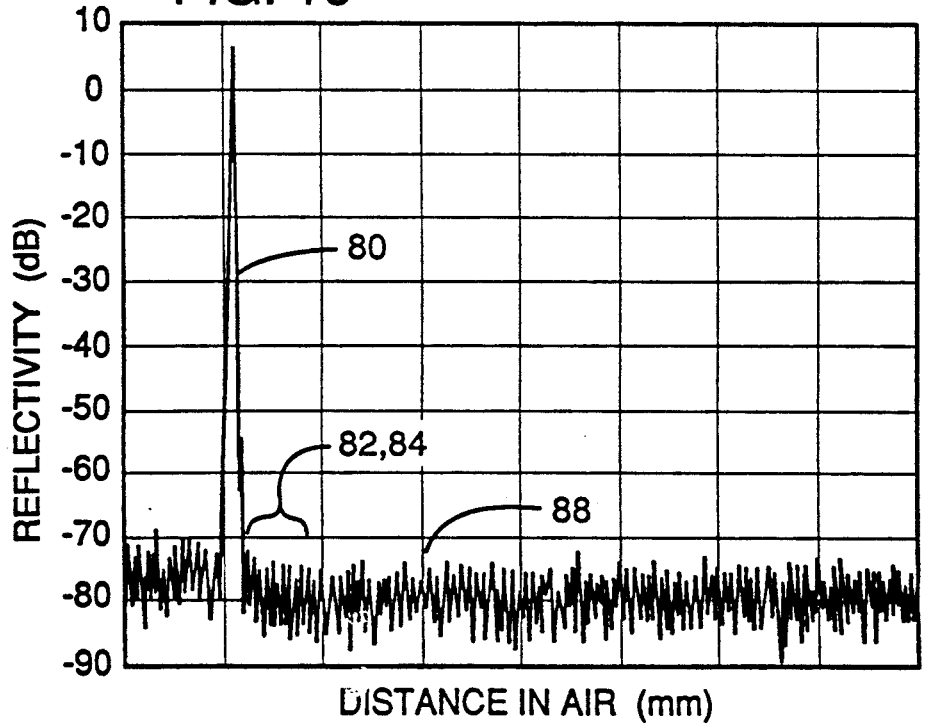
FIG. 16 is a spectrum like FIGS. 14A and 14B showing the reduction of internally reflected signal components from increasing device stripe width and adding antireflection coating to the front facet.

While the back facet reflection was the most pressing problem with the standard EELED outputs because of its narrow width and large signal strength, EELEDs such as that measured in FIGS. 14A and 14B also produce other reflection signal features. The broad reflection signal 82 from the gain region probably arises from scattering off of the edges of the mesa which is formed during processing. Signal peaks 84 are due to an internal reflection from the gain/absorber interface. Adding the AR coating and using wider (about 8 micron) stripes enables reduction of all reflected signal features (82, 84, 88) to less than −85 dBc as shown in FIG. 16. The shot noise limit of the detection system is at about −85 dBc. Thus there is no point to reducing the reflections any farther because it is impossible to measure any signal below −85 dBc.

The device demonstrated in FIGS. 14–16 used a multiple quantum well (MQW) structure for the active region, which proves to be a particularly effective absorber. The invention can also be implemented using a bulk semiconductor active region. This device should put out more power but probably not absorb as well, so back facet reflections may be larger. The Franz-Keldysch effect moves the absorption edge of the bulk material to longer wavelengths, but it is a weaker effect than the Stark effect in quantum wells. Other measures can be taken to reduce internal reflections, however, besides using an AR coating on the back facet.

Figure 6:
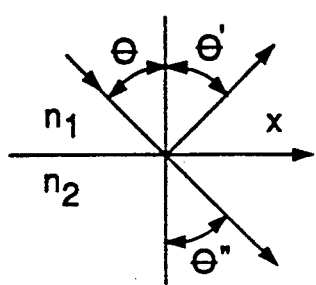
FIGS. 6–8 are diagrams of the geometry of anti-reflection measures in an absorber as used in the present invention.
Figure 7:
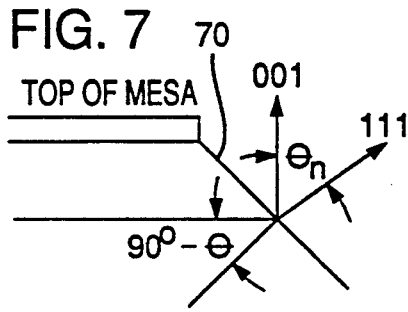
Figure 8:
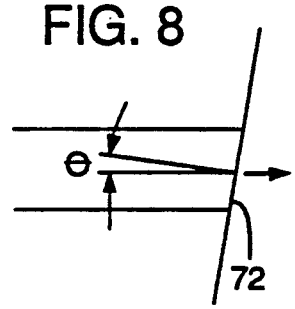

FIGS. 6–8 are diagrams of the geometry of anti-reflection measures in an absorber as used in the present invention. FIG. 6 shows the general case of partial and total internal reflection of incident light at a dielectric interface. From this relationship, the back facet of the absorber can be inclined to reduce the amount of light reflected back toward the gain region. It can be inclined in a vertical direction as shown in FIG. 7, e.g., by wet etching which produces a $\theta_n = 54.70$. This angle causes the incident light to be totally internally reflected at an angle off the axis of the cavity so that it is not conducted back into the waveguide except for some scatter.

Figure 9:
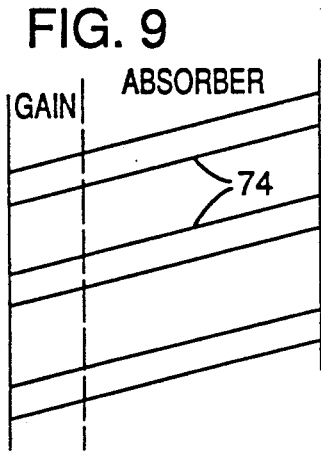
FIGS. 9, 9A, 9B and 9C are sections of alternative embodiments of anti-reflection absorbers in the present invention.
Figure 9A:
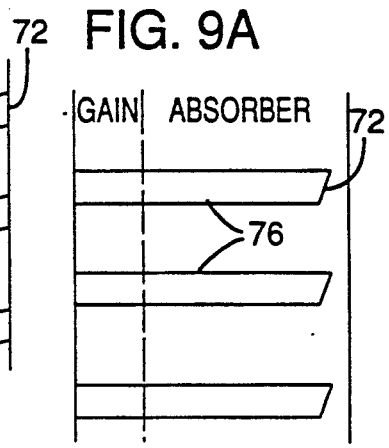
Figure 9B:
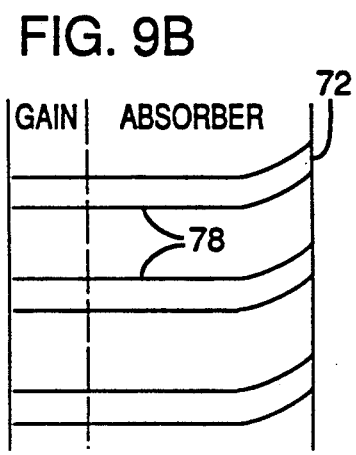
Figure 9C:
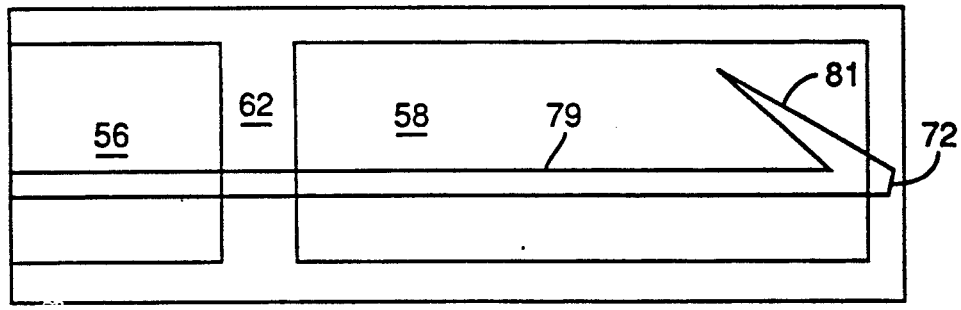

Alternatively, the back facet is slightly inclined laterally as shown in FIG. 8 to transmit the majority of the light out through the back facet and reflect the remainder internally but off axis so as not to be waveguided, e.g., $\theta$ at least 8°. FIGS. 9, 9A and 9B are sections of alternative embodiments. FIG. 9 shows a tilted stripe which an angle both end facets. FIG. 9A shows a truncated stripe with a tilted end etched into the waveguide stack. FIG. 9B shows a curved absorber. FIG. 9C shows an absorber 79 with a straight channel terminating in an etched back facet 72 as in FIG. 9A but broadened asymmetrically to form a beam dump 81.

Another source of internal reflections is the interface between the forward biased gain region and the reverse biased absorber region, due to variations in carrier density under different bias conditions. This can be alleviated by grading the bias between the two regions. FIGS. 10, 11 and 12 are top plan views of alternative embodiments of biasing structures. In FIG. 10, there are a series of step contacts 57A, 57B, 57C which can be biased in steps to stretch the distance over which the diode turns on and thereby extend the distance over which the carrier density changes, thus reducing the peak amplitude of the reflections. This can be implemented using a simple voltage divider to apply stepped voltages to the step contacts and the absorber contact. Alternatively, the gain and absorber contacts can be separated by a diagonal gap 62A, as with contacts 56A, 58A shown in FIG. 11, which distributes the turn-on equipotential at an angle to the waveguide axis so that any internal reflections are off-axis and will not be waveguided. The approaches of FIGS. 10 and 11 are combined in FIG. 12, which has a single parallelogram-shaped step-down contact 59.

Having described and illustrated the principles of the invention in a preferred embodiment thereof, it should be apparent that the invention can be modified in arrangement and detail without departing from such principles.

I claim all modifications and variation coming within the spirit and scope of the following claims:

1. A non-lasing edge-emitting LED comprising:
a semiconductor heterostructure body including a stack of parallel layers forming a vertically-confining waveguide and a PN junction to define an elongate optical cavity containing an active region;
the cavity including a gain region of a length $L_g$ and an optical absorber region in series with the gain region, the optical absorber region having an absorption spectrum; and
contact means for biasing the PN junction, including a gain contact for forward biasing the gain region so as to produce light emission including stimulated emission from the active region along an edge of the stack, and an absorber contact for reverse biasing the optical absorber region to reduce the optical absorber region band edge photon energy below the zero bias band photon energy;
the optical absorber region, under reverse bias, having a length $L_\alpha$ sufficient to preclude regenerative oscillation of light in the cavity during light emission.

2. A non-lasing edge-emitting LED according to claim 1 in which the absorber region is sized to a length $L_\alpha$ of at least 50 microns.

3. A non-lasing edge-emitting LED according to claim 1 in which the absorber region is sized to a length $L_\alpha$ equal to or exceeding the length $L_g$ of the gain region.

4. A non-lasing edge-emitting LED according to claim 1 in which the absorber region is sized to a length $L_\alpha$ of three times or more the length $L_g$ of the gain region.

5. A non-lasing edge-emitting LED according to claim 4 in which the gain region is sized to a length $L_g$ of about 300 microns.

6. A non-lasing edge-emitting LED according to claim 1 in which the absorber region is sized to a length $$L_\alpha > (gL_g - \tfrac{1}{2}\ln(1/R_1R_2))/\alpha,$$

where g and $\alpha$ are coefficients of gain and absorption and $R_1$ and $R_2$ are reflectivities of front and back facets of the cavity, such that round-trip power loss through the cavity is at least 70 dB.

7. A non-lasing edge-emitting LED according to claim 1 in which the body comprises a strongly-laterally index guided heterostructure laterally isolated by a nonconducting material to define an index-guided cavity for stimulated emission in the gain region and Stark absorption in the absorber region.

8. A non-lasing edge-emitting LED according to claim 1 in which the contact means includes an intermediate contact spaced between the gain and absorber contacts for biasing to an intermediate bias relative to the gain bias.

9. A non-lasing edge-emitting LED according to claim 1 in which the stack is sized to a stripe width of about 8 microns.

10. A non-lasing edge-emitting LED according to claim 1 in which the active region comprises a quantum well structure.

11. A non-lasing edge-emitting LED according to claim 1 in which the optical absorber region is sized to a length $L_\alpha$ sufficient, under reverse bias, to limit round trip reflection of light in the cavity to less than −60 dB.

12. A non-lasing edge-emitting LED according to claim 1 in which the contact means includes means for controlling a change in refractive index of the cavity at an interface between the gain and absorber regions to suppress internal reflections from the interface.

13. A non-lasing edge-emitting LED according to claim 1 in which the stack includes a back facet defining one end of the cavity in the absorber region, the back facet being angled so as to suppress internal reflection of light in the waveguide.

* * * * *